US006670639B1

(12) United States Patent
Okabayashi et al.

(10) Patent No.: US 6,670,639 B1
(45) Date of Patent: Dec. 30, 2003

(54) COPPER INTERCONNECTION

(75) Inventors: Hidekazu Okabayashi, Tokyo (JP);
Akiko Fujii, Tokyo (JP); Kazuyoshi Ueno, Tokyo (JP); Shuichi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/009,869

(22) PCT Filed: Jun. 21, 2000

(86) PCT No.: PCT/JP00/04031

§ 371 (c)(1),
(2), (4) Date: Dec. 11, 2001

(87) PCT Pub. No.: WO00/79585

PCT Pub. Date: Dec. 28, 2000

(30) Foreign Application Priority Data

Jun. 22, 1999 (JP) ............................................ 11-175564

(51) Int. Cl.$^7$ ............................................... H01L 29/04
(52) U.S. Cl. ......................................................... 257/64
(58) Field of Search .................................... 257/64, 49

(56) References Cited

U.S. PATENT DOCUMENTS

| 5,690,752 A | * | 11/1997 | Yamamoto et al. | ......... | 148/302 |
| 5,709,958 A | * | 1/1998 | Toyoda et al. | ............... | 428/650 |
| 6,001,461 A | * | 12/1999 | Toyoda et al. | ............... | 428/210 |
| 6,451,682 B1 | * | 9/2002 | Fujikawa et al. | ........... | 438/618 |

FOREIGN PATENT DOCUMENTS

| EP | 0 626 722 A1 | 11/1994 |
| JP | 61-027656 | 2/1986 |
| JP | 1-125954 | 5/1989 |
| JP | 3-119727 | 5/1991 |
| JP | 3-166731 | 7/1991 |
| JP | 4-326521 | 11/1992 |
| JP | 5-315327 | 11/1993 |
| JP | 6-275617 | 9/1994 |
| JP | 11-288937 | 10/1999 |
| WO | WO 93/16487 | 8/1993 |

OTHER PUBLICATIONS

Okabayashi, Evaluation of the Microstructure of Cu Film by the EBSD Method:, Institution of Electrical Engineers Research Society Data, Japan, Incorporated by Institution of Electrical Engineers, Apr. 7, 2000, EFM–00–1–8, pp. 1 to 6.
Okabayashi H. et al., 29p–ZQ–17 "Denshisen Kouhou San-ran Kaisetsuhou ni yoru Mekki Cu Maku no Bisai Kozo Hyouka", *Extended Abstracts of the 46$^{th}$ Spring Meeting of the Japan Society of Applied Physics and Related Societies*, 2:889 (1999).
Giannuzzi L A et al., "Transmission Electron Microscopy of Electrodeposits", Journal of Electronic Materials, vol. 22, NR. 6, pp. 639–644 (Nov. 2, 1992).
Koetter T et al., "Grain Growth and Twinning in Copper Thin Films for ULSI Circuits", AIP Conference Proceedings, American Institute of Physics, NY, NR. 491, pp. 271–276 (Jun. 23, 1999).

(List continued on next page.)

*Primary Examiner*—David Nelms
*Assistant Examiner*—Thao Le
(74) *Attorney, Agent, or Firm*—Scully, Scott, Murphy & Presser

(57) ABSTRACT

The present invention relates to a copper interconnection comprising a copper or copper alloy layer, wherein at least 50% of crystal grains of copper or a copper alloy form twins. A copper interconnection of the present invention is, therefore, highly reliable, and, a production cost thereof is low.

5 Claims, 4 Drawing Sheets

OTHER PUBLICATIONS

Zielinski E M et al., "The Effects of Processing on the Microstructure of Copper Thin Films on Tantalum Barrier Layers", Materials Research Society Symposium Proceedings, Materials Research Society, PA, vol. 391, pp. 303–308, (Apr. 17, 1995).

Giannuzzi L A et al., "On the Origin of Deformation Twinning in Electrodeposits and the Phenomenon of Cross–Twinning", Scripta Metallurgica, Elsevier Science Ltd., GB, vol. 23, NR. 8, pp. 1353–1358 (Jul., 1989).

Zielinski E M et al., "Microstructural Characterization of Copper Thin Films on Metallic Underlayers", Materials Reliability in Microelectronics, vol. 338, pp. 307–312 (Apr. 5, 1994).

Gross M E et al., "Microstructure and Texture of Electroplated Copper in Dramascene Structures", Materials Research Society Symposium Proceedings, Materials Research Society, PA, vol. 514, pp. 293–298 (Apr. 13, 1998).

* cited by examiner 2.00 μm

COPPER INTERCONNECTION

TECHNICAL FIELD

The present invention relates to a highly reliable and, at the same time, easily manufacturable interconnection in which copper or a copper alloy is utilized.

BACKGROUND ART

Copper and copper alloys containing tin or such in addition to copper have come into wider use for interconnections of the integrated circuits, in place of aluminium, to serve as high-performance and, at the same time, highly reliable interconnections for the LSIs (Large Scale Integrated Circuits), since they have lower resistances than those of aluminium and aluminium alloys as well as high resistances against migration (electromigration and stressmigration).

For the aluminium-based interconnections, with the object of improving reliability of interconnections, good efforts have been being made to form, satisfactorily, films of the large grain size and highly <111> oriented films. The use of a film of the large grain size which shows, at the same time, high preference of the <111> texture has, in essence, an effect equivalent to a reduction of the grain boundaries of the high migration velocity for atoms.

In general, the migration velocity for atoms which pass through a random grain boundary, separating adjacent crystal grains between which a large difference in orientation (misorientation) is present and any specific orientational relationship is absent, or a grain boundary in weak orientational relationship (a grain boundary having a large $\Sigma$-value, a $\Sigma$-value being defined as the reciprocal number of the density for coincident lattice sites in so-called coincident grain boundary) is markedly high in comparison with that for atoms which pass through a lattice or coincident grain boundary having a small $\Sigma$-value.

Accordingly, for the wide interconnections such as the interconnection used for the power supply line (generally said as the interconnections having a width greater than the average grain diameter or the interconnections with polygranular grain boundary structures) where the migration for passing through grain boundaries is dominant, the reduction of such grain boundaries of the high migration velocity for atoms is considered to be one of the standard strategies for enhancing the migration resistance.

When the line width becomes less than the average grain diameter, the grain boundary structure of the interconnection takes a near-bamboo grain boundary structure wherein polygranular grain boundary sections and bamboo grain boundary sections mix, while, in the interconnection with a still narrower width, it takes a bamboo grain boundary structure comprising hardly any polygranular grain boundary sections. In the interconnection with a near-bamboo grain boundary structure, the migration resistance is basically determined by the migration velocities to pass through grain boundaries in the polygranular grain boundary sections.

As against this, in the bamboo grain boundary interconnection, because there exists no continuous grain boundary running from end to end in the direction of the interconnection length, the long-range migration for atoms basically depends on the migration to pass through interfaces between interconnection metals and insulating films and/or interfaces between layers of a multi-level interconnection metal.

Further, with respect to the short-range migration from the inside of the interconnection to the interface, a large component thereof is considered to pass through bamboo grain boundaries so that, in this case, too, the increase of coincident grain boundaries having small $\Sigma$-values, in other words, the strengthening of the <111> orientation is regarded as an effective means to achieve the enhancement of migration resistance, though not so effective as for the polygranular interconnection.

The migration resistance depends on not only the migration velocities as described above but also the degree of liability and the actual place of the void creation. Voids are liable to form at the intersections of the grain boundaries with the interconnection surfaces (including lateral and bottom faces). Since voids are particularly apt to form at the places where random grain boundaries or coincident grain boundaries having large $\Sigma$-values intersect with the surfaces, the strengthening of the <111> orientation and its resultant reduction of such grain boundaries are also regarded as an effective means to achieve an improvement of the migration resistance.

Similarly, for the copper interconnections, an application of a film of the large grain size for the purpose of enhancing the migration resistance (Japanese Patent Application Laid-open No. 315327/1993) and a method of forming a film of the large grain size, which shows, at the same time, high preference of the <111> orientation (Japanese Patent Application Laid-open No. 125954/1989) have been reported. Further, there have been reported that an use of a copper film having a percentage of the <111> orientation of 90% or greater heightens the acid resistance of the Cu interconnection (Japanese Patent Application Laid-open No. 275617/1994), or enhances the migration resistance thereof (Japanese Patent Application Laid-open No. 27656/1986).

Nevertheless, the present inventors found out that, in the case of the copper interconnection, the formation of a film of the large grain size, which has, at the same time, orientation with strong preference for one direction, is not so easy as that in the case of the aluminium interconnection, and this gives rise to a problem that a specific manufacturing step must be additionally introduced or conditions of manufacturing steps must be limited to a narrower range.

DISCLOSURE OF THE INVENTION

An object of the present invention is to provide a highly reliable and, at the same time, easily manufacturable interconnection containing copper or a copper alloy, without utilizing a film having orientation with particularly strong preference for one direction, which is difficult to manufacture but has been sought after in the conventional techniques.

The present invention, which is to attain the above object, provides an interconnection comprising a copper or copper alloy layer, wherein at least 50% of crystal grains of copper or a copper alloy form twins.

The present invention can, thereby, provide a copper or copper alloy interconnection which is highly reliable and, at the same time, manufacturable at low production cost.

BEST MODE FOR CARRYING OUT THE INVENTION

In a twin of copper, normally, a twin boundary with one of the {111} planes is coherently formed. Herein, in defining a crystal grain, any coherent twin boundary is also regarded as a grain boundary. The electromigration velocity for atoms to pass through such a coherent twin boundary is essentially as small as that to pass through a crystal lattice, and, therefore, from the viewpoint of reliability, the presence of this twin boundary can be substantially ignored, and two crystal grains forming a twin can be regarded, in substance, as one large crystal grain.

In other words, the grain diameter is, in effect, made larger. In a polygranular grain boundary structure interconnection having a line width greater than the average grain diameter, when crystal grains become larger, the number of grain boundaries present in the direction of the interconnection length decreases and the migration velocities fall so that a more marked enhancement of the electromigration resistance can be brought about.

Further, also in a near-bamboo or bamboo grain boundary interconnection having a line width equal to or less than the average grain diameter, as short-range migrations decrease, the migration resistance is enhanced, though not so much as in the polygranular grain boundary interconnection.

Further, a formation of twins results in a decrease in grain boundary energy of the whole film. That is, grain boundaries of high energy disappear and grain boundaries of low energy and twin boundaries come into being. In other words, the energies of grain boundaries other than twin boundaries decrease.

The grain boundary of low grain boundary energy is basically the grain boundary having a low $\Sigma$-value, and the electromigration velocity for atoms passing through a grain boundary of this sort is considered to be lower than the electromigration velocity for atoms passing through a grain boundary of high grain boundary energy. In short, a formation of twins is expected to bring about not only a reduction of random grain boundaries by making, in effect, the grain size larger but also a decrease in the electromigration velocities of grain boundaries other than twin boundaries.

Further, even at the intersections of the grain boundaries with the surfaces, which are often the places of the void creation, if the grain boundary energy is low, the void creation becomes hard to happen and, thus, the migration resistance is expected to rise. This effect brings an advantageous result not only to the polygranular grain boundary interconnections but also to the near-bamboo grain boundary or bamboo grain boundary interconnections having a line width smaller than the average grain diameter.

Figure 1:
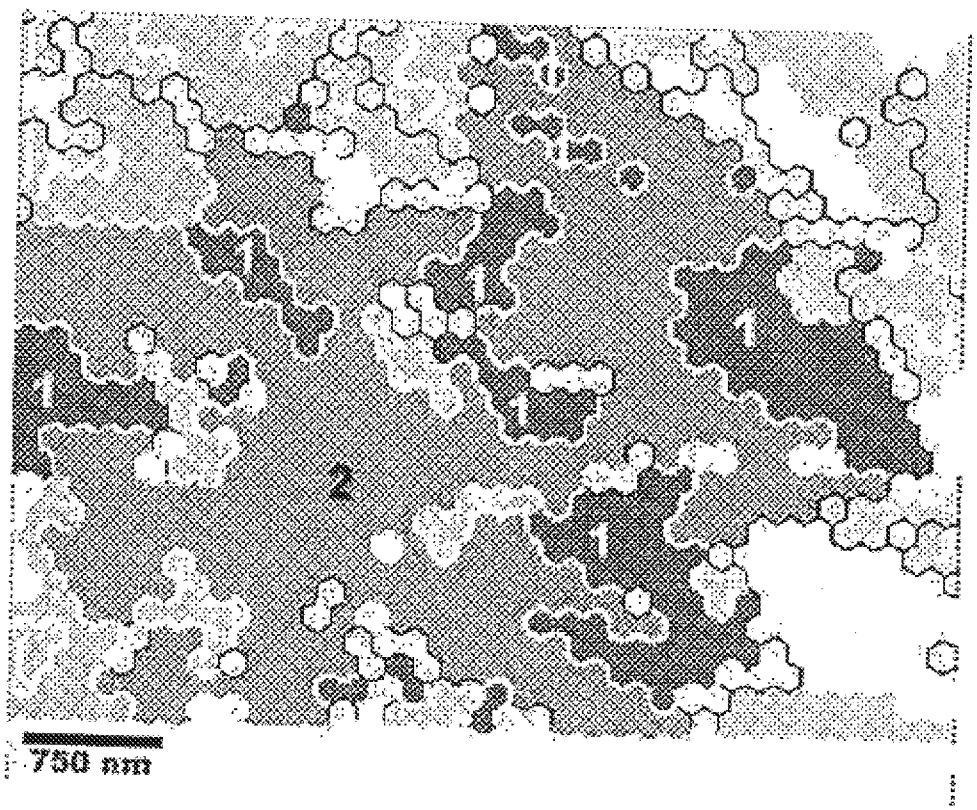
FIGS. 1–4 are views each showing a twin state for a film of Examples 1–4 of the present invention.

Further, the present inventors recognized a fact that a structure described by a repeated sequence as A/B/A . . . where A/B is a twin having two orientations (referred to as A and B) is often produced (corresponding to grains 1 and 2 in FIG. 1. In this instance, the orientations of grains 1 and 2 were <111> and <511> orientations, respectively, but combinations of other orientations were also observed). Such a structure therein can be taken for an extremely large crystal grain, in substance. Further, if it happens with copper, owing to its low grain boundary formation energy, such a film wherein a great portion of crystal grains are in the twinning relationship and two directions are preferentially taken for their orientations can be readily formed, and the formation of a film becomes much easier than the conventional formation of a highly <111> oriented texture.

Now, a method of manufacturing an interconnection comprising a copper or copper alloy layer according to the present invention is described below.

First, a copper or copper alloy film (referred to as a copper-based film hereinafter) is grown by the electroplating method, the chemical vapour deposition (CVD) method, the sputtering method or the like. The obtained copper-based film is then subjected to a heat treatment so as to make at least 50% of crystal grains of copper or a copper alloy form twins.

The heat treatment is carried out, for example, in the following steps. First, a substrate on which a copper-based film is formed is disposed in a heating furnace and the inside of the heating furnace is then filled with a gas (an inert gas) which does not react with the copper-based film, such as nitrogen, helium or argon. After that, by raising the temperature of the heating furnace, a substrate temperature is set to be in the range of 80° C. –120° C. The following steps are, herein, all carried out in the inert gas environment.

Next, while controlling a rate of heating, the substrate temperature is raised. With the object of having a prescribed effect upon the structure of crystal grains that are to be obtained, namely, ma king at least 50% of crystal grains of copper or a copper alloy form twins, the rate of heating is set to be preferably not less than 1° C./min, and more preferably not less than 5° C./min. Further, it is set to be preferably not greater than 50° C./min, and more preferably not greater than 30° C./min.

After the substrate temperature reaches a target temperature, using the temperature regulation, the substrate temperature is kept within the range of ±5° C. from the target temperature. With the object of having a prescribed effect upon the structure of crystal grains that are to be obtained, namely, making at least 50% of crystal grains of copper or a copper alloy form twins, the target temperature is set to be preferably not lower than 180° C., and more preferably not lower than 200° C. Further, it is set to be preferably not higher than 500° C., and more preferably not higher than 400° C. Further, the holding time at the target temperature is set, depending on the area of the copper-based film, though normally it is not shorter than 5 minutes but not longer than 10 hours.

After completing the treatment at the target temperature, the substrate temperature is lowered, while controlling a rate of cooling. With the object of having a prescribed effect upon the structure of crystal grains that are to be obtained, namely, making at least 50% of crystal grains of copper or a copper alloy form twins, the absolute value of the rate of cooling is set to be preferably not less than 1° C./min, and more preferably not less than 5° C./min. Further, it is set to be preferably not greater than 50° C./min, and more preferably not greater than 30° C./min.

The copper-based film obtained in the manner described above is made into an interconnection by the method of working into the form of an interconnection, such as the chemical mechanical polishing (CMP) method, the wet etching method or the dry etching method.

Although here is shown an example in which working into the form of an interconnection is performed after the heat treatment, the heat treatment can be carried out after the interconnection is shaped by means of working into the form of an interconnection. When the latter method is employed, the optimization of the holding time at the target temperature in the heat treatment is made, depending on the line width, and, herein, if the line width is wide, the holding time is to be set long.

In the manufacturing method as described above, although, in the case of the copper interconnection, formation of a film of the large grain size, which has, at the same time, orientation with strong preference for one direction, is not so easy as that in the case of the aluminium interconnection, it is not necessary that a specific manufacturing step is additionally introduced or conditions of manufacturing steps is limited to a narrower range.

Further, through the manufacturing method as described above, twins in the copper-based film form coherent twin boundaries. The electromigration velocity for atoms to pass through such a coherent twin boundary is essentially as small as that to pass through a crystal lattice so that, from the viewpoint of reliability, the presence of such a twin boundary can be substantially ignored, and two crystal grains forming a twin can be regarded, in substance, as one large crystal grain, and, thus, the grain diameter is, in effect, made larger. An increase in the crystal grain size lowers the migration velocities, owing to a decrease in the number of grain boundaries. Further, by formation of twins, the grain boundary energies drop. A decrease in grain boundary energies reduces a probability of the void formation in the grain boundary sections. These effects bring about an enhancement of the electromigration resistance.

Referring to Examples, the present invention is described in detail, below.

EXAMPLE 1

As Example 1, there are described results for a <511> orientation copper film (Film 1) which was fabricated by applying electroplating onto a structure of a copper seed layer/tantalum/silicon oxide/a silicon substrate which utilizes a barrier film tantalum as well as a copper seed layer formed by collimation sputtering.

FIG. 1 shows a part of a crystal grain map obtained in the measurements by the electron back-scatter diffraction (the abbreviation, EBSD, is also used hereinafter) method for a film which was fabricated by plating a copper film and thereafter applying a heat treatment thereto with a target temperature of 210° C. in nitrogen gas for 30 minutes.

Herein, after the substrate temperature was raised to 100° C., it was further raised to 210° C. at a heating rate of 10° C./min. The temperature was then kept at 210° C. for 30 minutes and thereafter it was lowered at a cooling rate of 15° C./min.

In the EBSD measurements, the orientations of respective crystal grains could be measured. Using these results of the measurements, the misorientations between given crystal grains could be calculated. The details of this technique can be found in "Microtexture Determination and Its Application" by V. Randle, The Institute of Materials, London, 1992.

The examination of twinning relationship among all of the crystal grains in FIG. 1 revealed that 46 in 50 (92%) of crystal grains which were large enough to cover two or more measured points (in this example, 0.04 $\mu m^2$ or greater) shown in FIG. 1 are in twinning relationship.

In FIG. 1, grain boundaries that separate adjoining grain boundaries having a twinning relationship with each other are shown by white lines, and grain boundaries that separate grain boundaries having no twinning relationship are shown by black lines. It is clearly seen herein that most crystal grains have twin boundaries indicated by white lines.

From such a crystal grain map, a comparison of the areas for crystal grain surfaces oriented with the direction of <100>, <110>, <111> or <511> was made, and its results showed that respective occupied areas in this film were 0% for <100> orientation grains, 2% for <110> orientation grains, 20% for <111> orientation grains, 56% for <511 ) orientation grains and 22% or less for others (including unmeasurable regions), and the <511> orientation grains were dominant.

EXAMPLE 2

Figure 2:
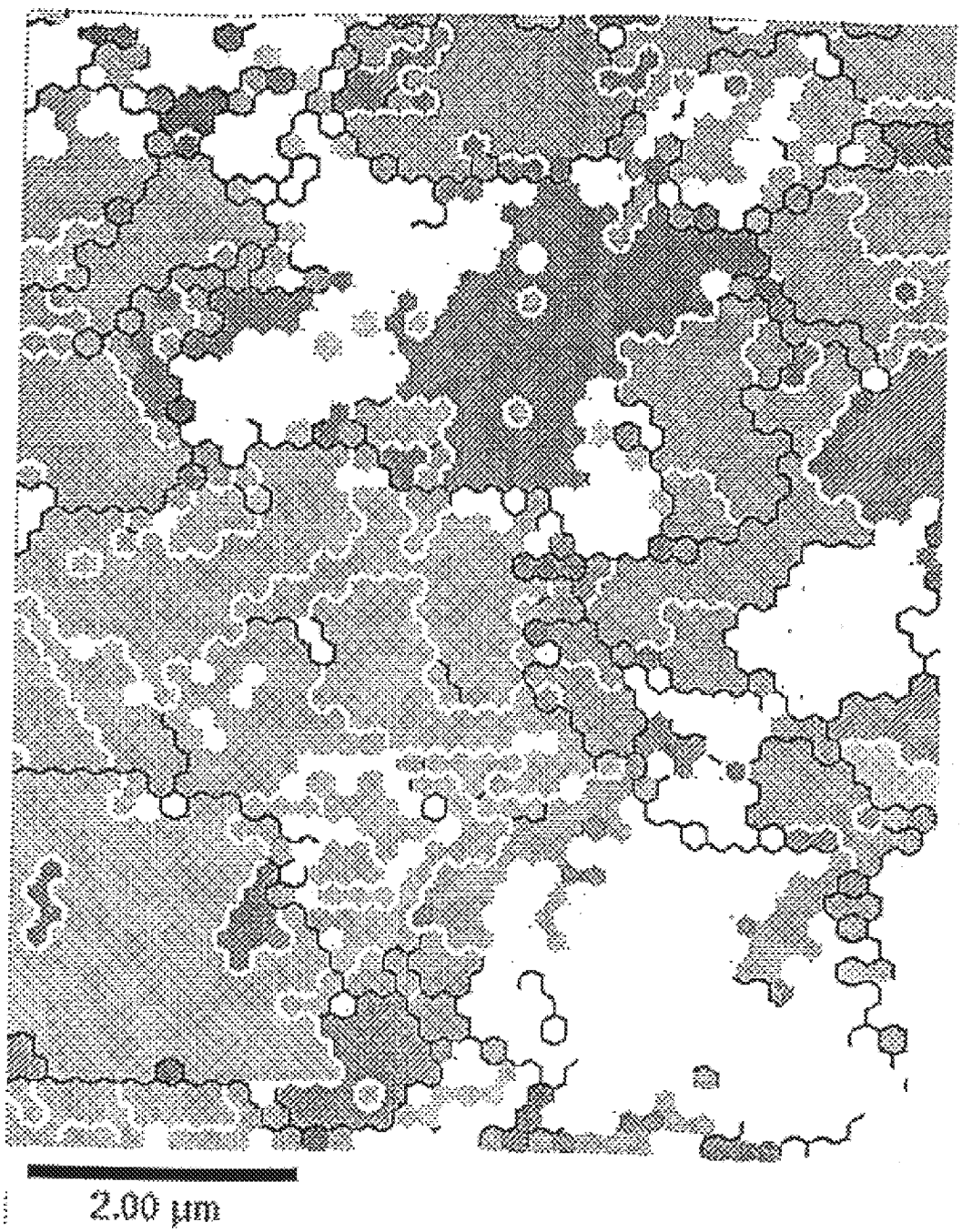

As Example 2, there are described results for a <111> orientation film (Film 2) wherein electroplating was applied onto a long throw sputtering seed. These results were obtained in the measurements made after the sample was left at the ambient temperature for 2000 hours and, as twin boundaries shown in FIG. 2 indicate, almost all large crystal grains are associated with twins in this sample, too.

However, respective occupied areas in this film were 30 % for <111> orientation grains, 23% for <511> orientation grains, 8% for <110> orientation grains, 7% for <100> orientation grains and 32% for other orientation grains, showing that this film has a different orientation from that of the above plating copper film 1.

Further, in a copper film into which ions such as copper, tantalum or gallium ions were implanted, it was confirmed that, although <100> orientation grains increased, at least 50% of crystal grains formed twins in any of those films.

EXAMPLE 3

Figure 3:
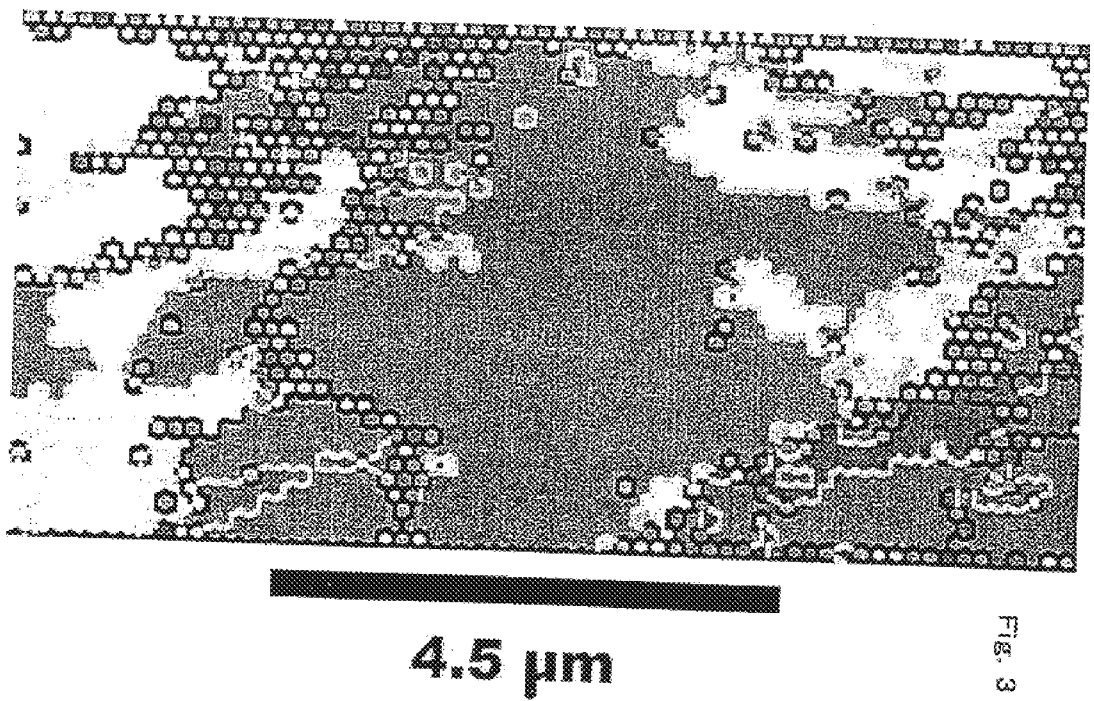

As Example 3, results obtained for damascene lines which were fabricated using the standard damascene line formation method are shown in FIG. 3. In this Example, there are presented results of interconnections with a width of 5 $\mu$m, confirming that at least 50% of crystal grains in the measurements were in twinning relationship, as in the case of the patternless film. Although, in the case of damascene lines, more unmeasurable regions (regions marked with dots of the minimum dimensions in FIG. 3) are found, in comparison with the measured results for the patternless film, this is presumably caused by abrasions or the like produced while forming interconnection patterns by the chemical mechanical polishing (CMP) method.

EXAMPLE 4

Figure 4:
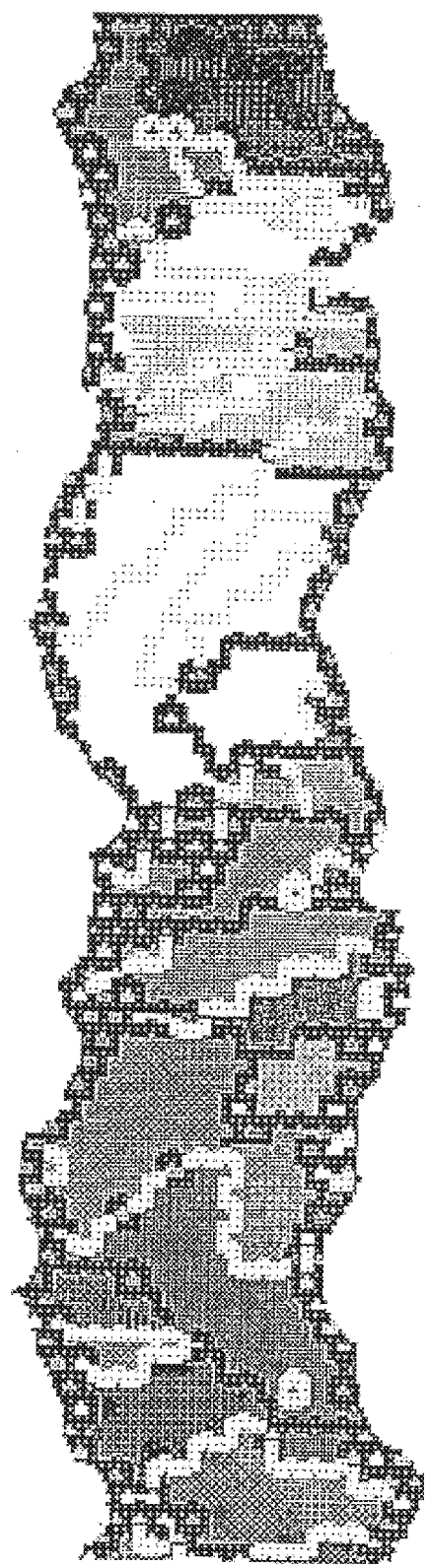

As Example 4, results for interconnections having a line width(0.56 $\mu$m in width) smaller than the average grain diameter, which were measured at a cross-section lying paralled to the direction of the interconnection length, are shown in FIG. 4. In this Example, too, at least 90% of crystal grains were in twinning relationship. While the interconnection structure that this cross-sectional view of grain boundary indicates is a near-bamboo grain boundary structure, results of measurements obtained on their interconnection surface also indicate a near-bamboo grain boundary structure. Furthermore, from analysis of data of the EBSD measurements, it is concluded that such a multiple twin structure as shown in FIG. 1 is present herein, and besides a large number of twin boundaries in bamboo grain boundary sections are coherent boundaries.

This result implies that, in the interconnections of the present Example, the rate of the void creation falls in the middle of an interconnection. Further, while the cross-section of the interconnection in FIG. 4 is not even but undulating, this is caused by a drift produced in an electron beam owing to charged insulating films lying around the interconnections, during the EBSD measurements.

Further, employing two different sorts of plating copper films which were formed under the same conditions as films in Examples 1 and 2 and using the standard damascene line formation technique for integrated circuits, there were fabricated damascene lines, one interconnection (with a line width of 8 $\mu$m) having a line width greater than the average grain diameter and the other interconnection (with a line width of 0.4 $\mu$m) having a line width less than the average grain diameter. The electromigration tests for fabricated interconnections were conducted at a temperature of 275° C. and a current density of 2 MA/cm$^2$. The results show, as presented in Table 1, the thick interconnection and the thin interconnection have approximately 10 times and 2.5 times lifetimes as long as that of an aluminium interconnection used for the reference, respectively, and, thus, both films could attain high reliability.

The above results are listed in Table 1.

TABLE 1

Electromigration Lifetime (T50)

| Sample Species | Lifetime (T50) | |
| --- | --- | --- |
| | Line Width: 8 μm | Line Width: 0.4 μm |
| Film 1 | 580 hours | 290 hours |
| Film 2 | 620 hours | 310 hours |
| Aluminium Interconnection | 50 hours | 120 hours |

T50: Time period to reach 50% failure.

At least 50% of crystal grains constituting the interconnections of Examples form twins. It is thought that this results in a reduction of grain boundaries which may adversely affect the migration, and, thus, an enhancement of the migration resistance.

Although Examples are herein described, making electroplating conditions constant, the present inventors observed that electroplating conditions, the seed material and its manufacturing conditions all affect the orientation of the film and the orientation of twins, but also realized that those matters do not much influence the twin formation.

While the present Examples are described using electroplating damascene lines, it is to be understood that the present invention is not limited to electroplating damascene lines and it is obvious to those skilled in the art that the present invention may be applied to conventional interconnections, if copper ones, which are formed by the copper film deposition method such as the chemical vapour deposition (CVD) method or the sputtering method, or by means of dry etching or the like.

What is claimed is:

1. An interconnection comprising a copper layer or a copper alloy layer, wherein at least 50% of crystal grains of the copper or the copper alloy form twins.

2. A copper interconnection as set forth in claim 1, wherein the interconnection width is greater than an average grain diameter of the crystal grains forming the twins of the copper or the copper alloy.

3. A copper interconnection as set forth in claim 1, wherein the interconnection width is smaller than an average grain diameter of the crystal grains forming the twins of the copper or the copper alloy.

4. A copper interconnection as set forth in claim 1, wherein, in the twin of the copper or the copper alloy, a twin boundary with one of the {111} planes is coherently formed.

5. A copper interconnection as set forth in claim 1, wherein the copper interconnection comprises a polygranular grain boundary structure, a near-bamboo grain boundary structure or a bamboo grain boundary structure.

* * * * *